United States Patent [19]
Elkhatib

[11] Patent Number: 5,823,801
[45] Date of Patent: Oct. 20, 1998

[54] ELECTRICAL CONNECTOR HAVING THIN CONTACTS WITH SURFACE MOUNT EDGES

[75] Inventor: Hecham Elkhatib, Mabane, N.C.

[73] Assignee: The Whitaker Corporation, Wilmington, Del.

[21] Appl. No.: 692,216

[22] Filed: Aug. 5, 1996

[51] Int. Cl.⁶ ................................................. H01R 9/09
[52] U.S. Cl. ............................................................ 439/83
[58] Field of Search ........................... 439/83, 62, 76–8, 439/82, 74

[56] References Cited

U.S. PATENT DOCUMENTS

| | | | |
|---|---|---|---|
| 4,629,278 | 12/1986 | Norton et al. | 339/134 |
| 5,137,454 | 8/1992 | Baechtle | 439/83 |
| 5,199,884 | 4/1993 | Kaufman et al. | 439/74 |

FOREIGN PATENT DOCUMENTS 0 373 003  6/1990  European Pat. Off. ........ H01R 23/72

WO 91/16736  10/1991  WIPO ............................... H01R 4/02

OTHER PUBLICATIONS

International Search Report dated Nov. 21, 1997 from International Application No. PCT/US 97/13628.

*Primary Examiner*—Neil Abrams
*Assistant Examiner*—Eugene G. Byrd
*Attorney, Agent, or Firm*—Robert Kapalka

[57] ABSTRACT

An electrical connector carries a plurality of contacts each comprising an electrically conductive body made of sheet material. The body of each contact has a thickness defined by thickness of the sheet material, and an outer edge extending through the thickness. The body includes a lead having an edge portion which is engageable with a circuit path on a substrate for surface mount solder attachment thereto, and the lead has a recess in the edge portion which provides a receptacle for solder during the surface mount solder attachment.

6 Claims, 2 Drawing Sheets

ELECTRICAL CONNECTOR HAVING THIN CONTACTS WITH SURFACE MOUNT EDGES

FIELD OF THE INVENTION

The invention relates to an electrical connector having contacts which are attached to a circuit board by surface mount soldering.

BACKGROUND OF THE INVENTION

Two known methods of attaching an electrical component to a circuit board are through-hole attachment and surface mount attachment. In the former method, the component has downwardly depending leads, or solder tails, which are inserted through conductively-plated holes in the board; in the latter method, the component has leads which extend substantially parallel to the board and rest on conductive pads on the surface of the board. In both methods the leads are soldered to the conductive elements on the board. Surface mount attachment has an advantage in that holes need not be drilled in the board, thereby saving time and expense. However, as electrical components are miniaturized, the component leads are being made smaller. Very fine leads, such as those which are edge-stamped from a sheet metal blank, have a narrow edge which provides little surface area to which solder can bond, thereby making it difficult to obtain reliable surface mount solder connections with these leads. There is a need for a device which facilitates surface mount attachment of very fine leads to a circuit board.

SUMMARY OF THE INVENTION

The invention includes an electrical connector and a contact for use in the connector. The connector comprises a dielectric housing which carries a plurality of contacts according to the invention. Each of the contacts comprises an electrically conductive body made of sheet material. The body has a thickness defined by thickness of the sheet material, and an outer edge extending through the thickness. The body includes a lead having an edge portion which is engageable with a circuit path on a substrate for surface mount solder attachment thereto, and the lead has a recess in the edge portion which provides a receptacle for solder during the surface mount solder attachment.

In a preferred embodiment of the contact, the recess extends fully through the thickness of the lead.

In another preferred embodiment of the contact, the recess is bounded by an arcuate wall and includes an undercut extending behind the edge portion.

BRIEF DESCRIPTION OF THE DRAWINGS

The invention will now be described by way of example with reference to the accompanying drawings wherein.

DETAILED DESCRIPTION OF THE PREFERRED EMBODIMENT

Figure 1:
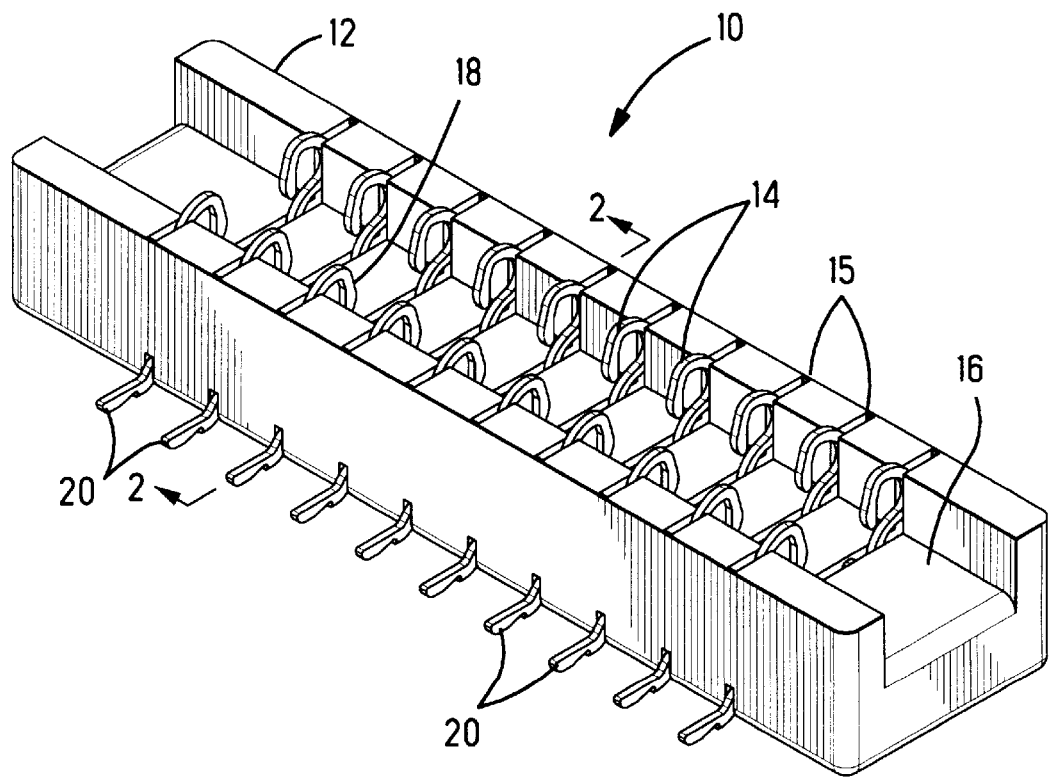
FIG. 1 is an isometric view of an electrical connector having contacts according to the invention.

There is shown in FIG. 1 an electrical connector 10 comprising a dielectric housing 12 which carries a plurality of contacts 14 in respective cavities 15 which are arranged in two longitudinal rows on opposite sides of a central slot 16. The contacts 14 have arms 18 which extend into the slot 16 for engagement with contact pads on a circuit card which is receivable in the slot. The contacts 14 also have solder tail leads 20 which extend horizontally outward of the housing for engagement with conductive traces on a circuit board or other substrate.

Figure 2:
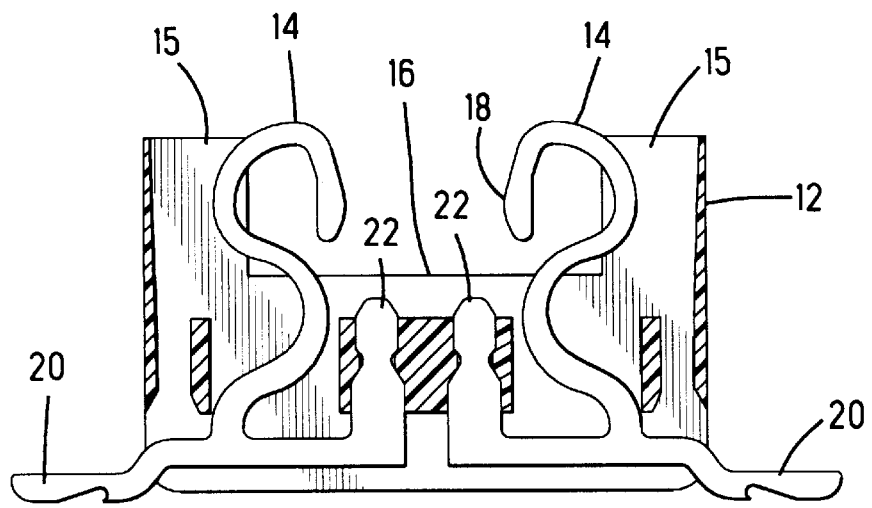
FIG. 2 is a cross-sectional view taken along line 2—2 of FIG. 1.

As shown in FIG. 2, each of the contacts 14 includes a retention post 22 which engages in a hole in the housing 12 with an interference fit, thereby retaining the contact in the housing.

The contacts 14 are preferably manufactured from a sheet metal blank having a thickness of approximately 0.010 inch. The sheet metal blank is edge-stamped or otherwise cut to remove excess material so that the resulting product is a carrier strip having a plurality of the contacts 14 attached thereto. The contacts attached to the carrier strip are configured with a desired final profile, thereby avoiding the need for a subsequent forming or bending operation. The contacts on the carrier strip may be coated or plated with materials selected to provide desirable characteristics such as good electrical conductivity, oxidation resistance and solderability. The contacts are severed from the carrier strip and inserted into the connector housing during an automatic insertion operation.

Figure 3:
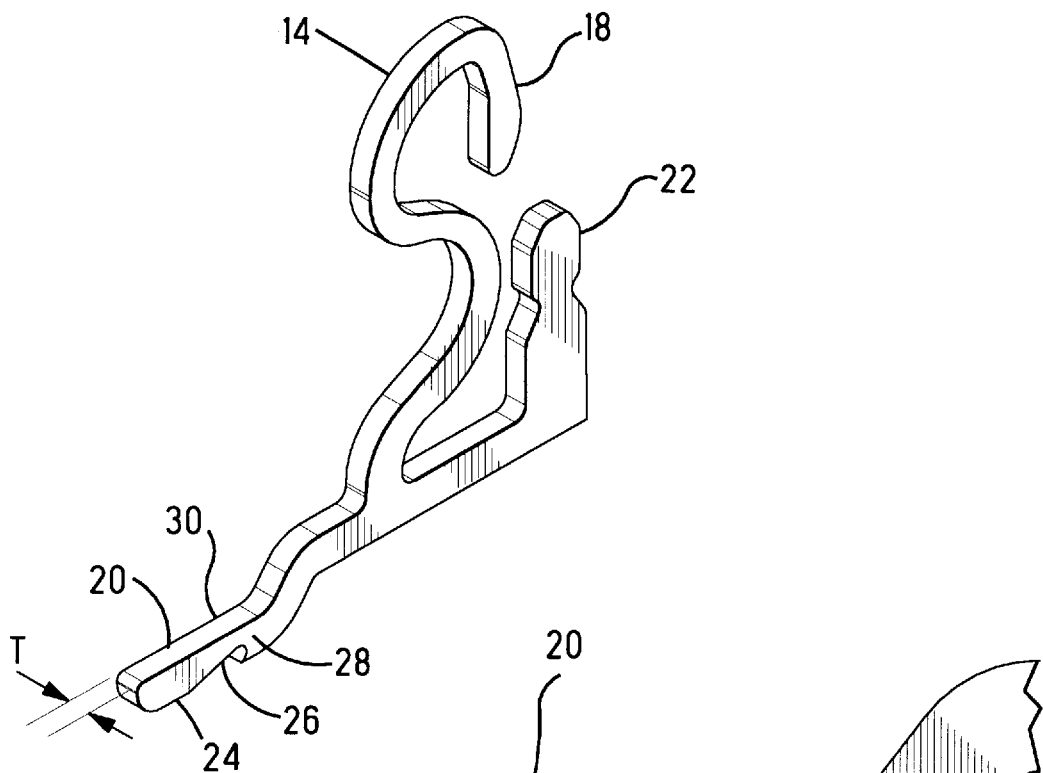
FIG. 3 is an isometric view of a contact according to the invention.

With reference to FIG. 3, each of the contacts 14 has a profile which is defined by a surrounding edge having a thickness T which is equal to the thickness of the sheet metal, and any additional coating thereon, from which it is cut. Since the thickness T is on the order of 0.010 inch, surface mount edge 24 of the solder tail lead 20 provides only a narrow area to which solder can attach during surface mount attachment to a circuit board.

In order to improve the solder connection between the lead 20 and the circuit board, a recess 26 is provided in the lead 20 along the surface mount edge 24. The recess 26 increases the surface area to which solder can bond and provides a receptacle for solder during a solder reflow process. Preferably, the recess 26 extends fully through the thickness of the lead 20, thereby permitting solder paste to form a bridge between opposite sides 28,30 of the lead 20. The recess 26 may be cut when the contact 14 is being cut from a blank, or the recess may be formed in a separate operation.

Figure 4:
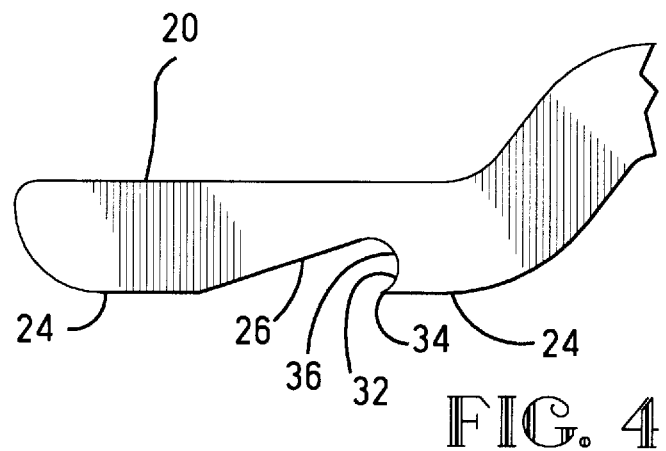
FIG. 4 is an enlarged front view of a solder tail lead of the contact in FIG. 3.

As best shown in FIG. 4, the recess 26 preferably includes an undercut 32 which extends behind the surface mount edge 24, thereby forming a lip 34 which can be locked between solder layers on the wall of the recess 26 and on the edge 24. The recess 26 is preferably bounded by an arcuate wall or fillet 36 which enhances solder locking and inhibits solder crack initiation that tends to occur due to repeated stress and strain cycles.

Figure 5:
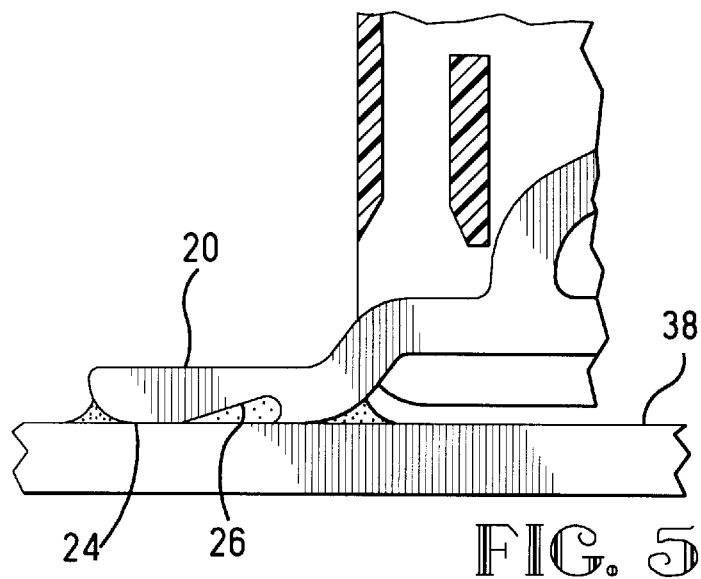
FIG. 5 is a partial cross-sectional view of the solder tail lead attached to a circuit board.

FIG. 5 depicts approximate solder buildup after surface mount attachment of the lead 20 to a circuit board 38. A mass of solder, as shown by stippling in the recess 26, accumulates on the wall of the recess and either partially or completely fills the recess, thereby increasing the strength of the solder joint between the lead and the circuit board.

The invention having been disclosed, a number of variations will now become apparent to those skilled in the art.

Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

I claim:

1. A contact for an electrical connector, comprising:

an electrically conductive body made of sheet material, the body having a thickness defined by thickness of the sheet material, the body including a lead having an edge which extends through the thickness, the edge being engageable with a circuit path on a substrate for surface mount solder attachment thereto, and the lead having a recess in the edge which provides a receptacle for solder during the surface mount solder attachment, the recess including an undercut which extends behind the edge to provide a lip which is available to be locked in the solder.

2. The contact according to claim 1, wherein the recess extends fully through the thickness of the lead.

3. The contact according to claim 1, wherein the recess is bounded by an arcuate wall.

4. An electrical connector comprising:

a dielectric housing which carries a plurality of contacts, each of the contacts comprising:

an electrically conductive body made of sheet material, the body having a thickness defined by thickness of the sheet material, the body including a lead having an edge which extends through the thickness, the edge being engageable with a circuit path on a substrate for surface mount solder attachment thereto, and the lead having a recess in the edge which provides a receptacle for solder during the surface mount solder attachment, the recess including an undercut which extends behind the edge to provide a lip which is available to be locked in the solder.

5. The electrical connector according to claim 4, wherein the recess of at least one said lead extends fully through the thickness thereof.

6. The electrical connector according to claim 4, wherein the recess of at least one said lead is bounded by an arcuate wall.

* * * * *